(12) United States Patent
Douskey et al.

(10) Patent No.: US 8,407,542 B2
(45) Date of Patent: Mar. 26, 2013

(54) IMPLEMENTING SWITCHING FACTOR REDUCTION IN LBIST

(75) Inventors: Steven Michael Douskey, Rochester, MN (US); Ryan Andrew Fitch, Auburn Hills, MI (US); Michael John Hamilton, Rochester, MN (US); Amanda Renee Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 296 days.

(21) Appl. No.: 12/844,120

(22) Filed: Jul. 27, 2010

(65) Prior Publication Data
US 2012/0030533 A1     Feb. 2, 2012

(51) Int. Cl.
*G06F 11/00*     (2006.01)

(52) U.S. Cl. .................................. 714/728; 714/733

(58) Field of Classification Search ................. 714/733, 714/734, 735, 738, 739, 728, 724, 729, 726
See application file for complete search history.

(56) References Cited

U.S. PATENT DOCUMENTS

| 7,028,239 B2 * | 4/2006 | Jaber ............................ 714/733 |
| 7,716,546 B2 * | 5/2010 | Le et al. ........................ 714/729 |
| 2009/0307548 A1 * | 12/2009 | Forlenza et al. .............. 714/729 |

\* cited by examiner

*Primary Examiner* — Dieu-Minh Le
(74) *Attorney, Agent, or Firm* — Joan Pennington

(57) ABSTRACT

A method and circuit are provided for implementing switching factor reduction in Logic Built in Self Test (LBIST) diagnostics, and a design structure on which the subject circuit resides. Switching factor reduction logic is coupled to a Pseudo-Random Pattern Generator (PRPG) providing channel input patterns to a plurality of LBIST channels used for the LBIST diagnostics. The switching factor reduction logic selectively provides controlled channel input patterns for each of the plurality of channels.

18 Claims, 8 Drawing Sheets

PRIOR ART
100

| CHANNEL | XOR BITS |
|---|---|
| 0 | 30 |
| 1 | 8,26 |
| 2 | 7,24 |
| * * * | * * * |
| 59 | 9,11,18 |
| 60 | 6,25,28 |
| 61 | 2,14,27 |

(12)  United States Patent
US 8,407,542 B2

IMPLEMENTING SWITCHING FACTOR REDUCTION IN LBIST

FIELD OF THE INVENTION

The present invention relates generally to the data processing field, and more particularly, relates to a method and circuit for implementing switching factor reduction in Logic Built in Self Test (LBIST) diagnostics, and a design structure on which the subject circuit resides.

DESCRIPTION OF THE RELATED ART

Logic Built in Self Test (LBIST) circuitry typically has a higher switching factor on an integrated circuit device or chip than chip operation during actual functional mode. This can result in LBIST fails on functionally good chips.

A current common attempt at switching factor reduction has been to use a channel weighting function. Originally added for potential test coverage improvement, the channel weighting function also reduces the chances of succeeding bits in a scan channel from differing. This then reduces the launch off scan release switching. Reduction of the switching from the normal ½ weighting, or a 50-50 mix of 1s and 0s, to a ⅛ or ⅞ weighting reduces the switching factor from about 50% to about 22%. A $1/16$ or $15/16$ weighting further approaches the typical functional switching rates. However, without the ½ switching rate, test coverage both from an attainable level and a number of patterns to reach a certain coverage will be negatively affected.

FIGS. 1A and 1B illustrates a standard channel weighting example circuit 100 including a Pseudo-Random Pattern Generator (PRPG), such as a 31 bit PRPG and an exclusive OR (XOR) logic 104 coupled to predefined PRPG outputs and providing a feedback input to the PRPG 102. The 31 bit PRPG 102 together with the XOR logic 104 implements a spreading function feeding 62 channels, as illustrated in FIG. 1B.

Conventionally there are two ways to weight a channel. The channel can be weighted towards 1s, which is implemented using OR gates, or towards 0s, which is implemented with AND gates. By varying the number of inputs to the weighting logic, the degree of weighting can be controlled. For example, to achieve $15/16$ weighting to 1s, the input to channel x would be the OR of channel x, x+1, x+2, and x+3. A standard run typically will weight an entire channel at the same rate, and all channels to this rate. This is effective for creating certain test patterns and for reducing the entire chip switching factor, but not effective as the only test.

A need exists for an effective and efficient mechanism for implementing switching factor reduction in Logic Built in Self Test (LBIST) diagnostics.

SUMMARY OF THE INVENTION

Principal aspects of the present invention are to provide a method and circuit for implementing switching factor reduction in Logic Built in Self Test (LBIST) diagnostics, and a design structure on which the subject circuit resides. Other important aspects of the present invention are to provide such method and circuit substantially without negative effects and that overcome many of the disadvantages of prior art arrangements.

In brief, a method and circuit are provided for implementing switching factor reduction in Logic Built in Self Test (LBIST) diagnostics, and a design structure on which the subject circuit resides. A switching factor reduction logic is coupled to a Pseudo-Random Pattern Generator (PRPG) providing channel input patterns to a plurality of LBIST channels used for the LBIST diagnostics. The switching factor reduction logic selectively provides controlled channel input patterns for each of the plurality of channels.

In accordance with features of the invention, the switching factor reduction logic includes a mask register that selects a 1 or 0 weighting for each channel at the beginning of the test, making the LBIST channels reduce switching, without the LBIST channels being weighted the same way.

In accordance with features of the invention, the mask register is rotated before every scan so that each test has a different mix of which LBIST channels are masked towards 1 or 0.

In accordance with features of the invention, the mask register is seeded by a PRPG.

In accordance with features of the invention, the switching factor reduction logic includes a clock control function coupled to the Pseudo-Random Pattern Generator (PRPG) selectively providing channel input patterns to the plurality of LBIST channels.

In accordance with features of the invention, the clock control function includes a synchronous clock gating unit applying a clock to the PRPG. The clock is gated by a signal generated from a small PRPG. During a cycle when the PRPG is not updated, the input pattern is stable or remains unchanged. The clock gating optionally is applied to the entire PRPG, but also could vary between different LBIST PRPGs to increase pattern variation.

In accordance with features of the invention, the switching factor reduction logic includes a pattern hold PRPG to randomly suppress a pattern transition. Scan buffering latches in the channels are used to hold their values during a scan based on the output of the pattern hold PRPG. The resulting pattern has a resulting switch factor equal to the ratio of the pattern hold multiplied by the original switch factor.

In accordance with features of the invention, the switching factor reduction logic is selectively applied over a portion of scan initialization data. The switching factor reduction logic enables low switching factor patterns in LBIST with enhanced test coverage over simple weighting.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits are provided for implementing switching factor reduction in Logic Built in Self Test (LBIST) diagnostics. A switching factor reduction logic is coupled to a Pseudo-Random Pattern Generator (PRPG) providing channel input patterns to a plurality of LBIST channels used for the LBIST diagnostics. The switching factor reduction logic selectively provides a one (1) or a zero (0) weighting for each of the plurality of channels. Another switching factor reduction logic selectively provides a clock control function.

Figures 1A, 1B:
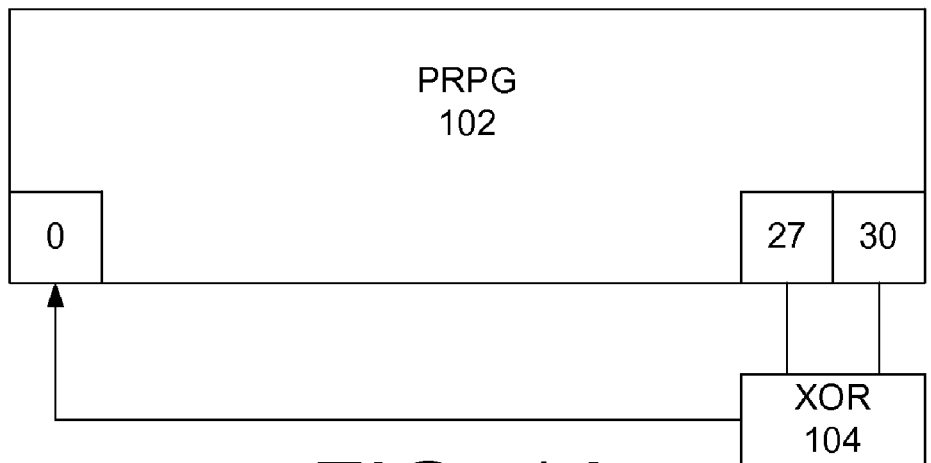
FIGS. 1A and 1B illustrates a prior art channel weighting example circuit.
Figure 2:
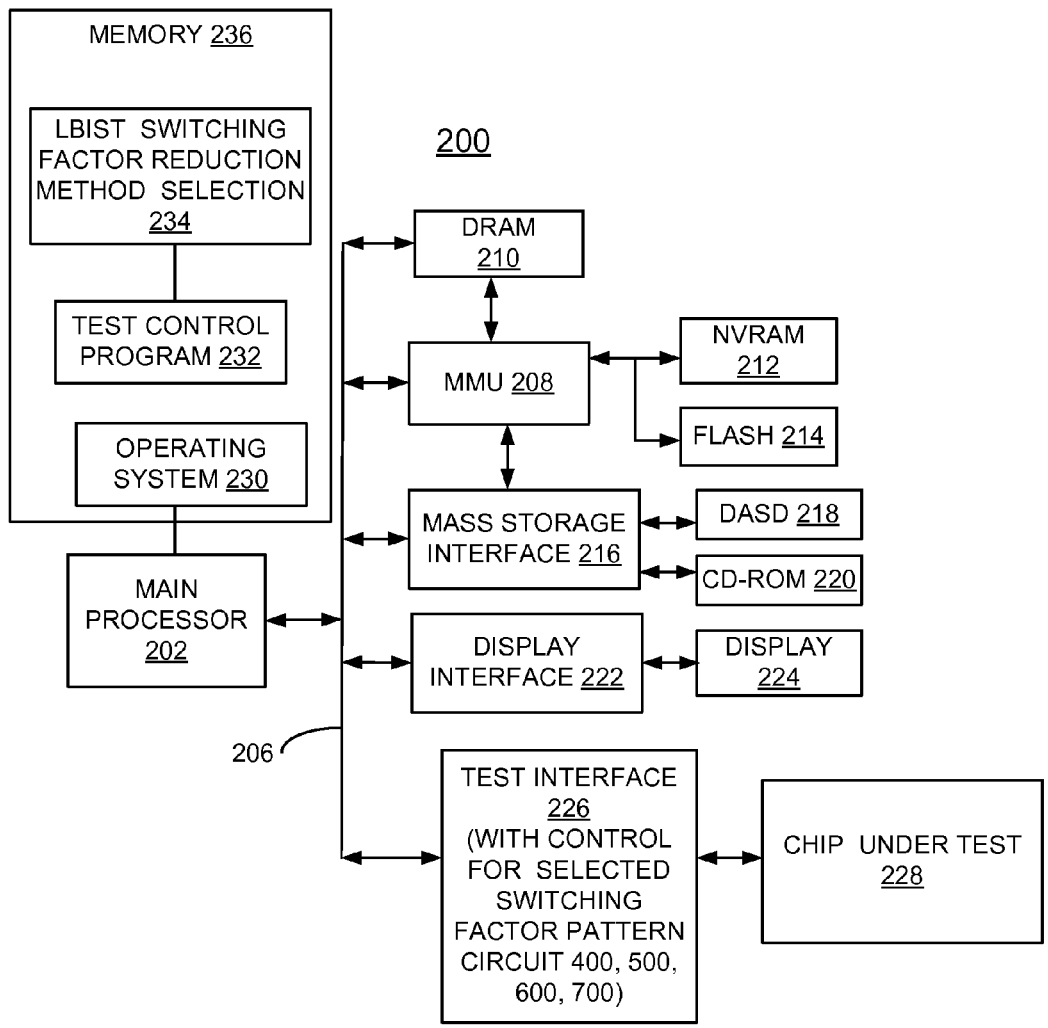
FIG. 2 is a block diagram representation illustrating an exemplary computer test system for implementing switching factor reduction in Logic Built in Self Test (LBIST) diagnostics in accordance with the preferred embodiment.

Having reference now to the drawings, in FIG. 2, there is shown an exemplary computer test system for implementing switching factor reduction in Logic Built in Self Test (LBIST) diagnostics generally designated by the reference character 200 in accordance with the preferred embodiment. Computer system 200 includes a main processor 202 or central processor unit (CPU) 202 coupled by a system bus 206 to a memory management unit (MMU) 208 and system memory including a dynamic random access memory (DRAM) 210, a nonvolatile random access memory (NVRAM) 212, and a flash memory 214. A mass storage interface 216 coupled to the system bus 206 and MMU 208 connects a direct access storage device (DASD) 218 and a CD-ROM drive 210 to the main processor 202. Computer system 200 includes a display interface 222 connected to a display 224, and a test interface 226 coupled to the system bus 206. An integrated circuit device or chip under test 228 is coupled to the test interface 226. Computer system 200 includes an operating system 230, a test control program 232, and an LBIST switching factor reduction method selection 234 of the preferred embodiment resident in a memory 236. The test interface 226 provides control for a selected switch factor pattern circuit 400, 500, 600, 700, for example, as illustrated and described with respect to FIGS. 4, 5, 6, and 7, responsive to a particular LBIST switching factor reduction method selection 234.

The particular switch factor circuit 400, 500, 600, 700 is selectively applied over a portion of scan initialization data by the test control program 232, for example, a start and stop count for each aperture is loaded prior to the test. This allows applying the weighting, stretching or smearing only over a portion of the scan initialization data. These values are then compared with the scan counter, to set and reset and enable latch for these functions. This allows a localized hot spot to have reduced switching, but still allows maximum switching and test coverage for other logic.

Computer test system 200 is shown in simplified form sufficient for understanding the present invention. The illustrated computer test system 200 is not intended to imply architectural or functional limitations. The present invention can be used with various hardware implementations and systems and various other internal hardware devices, for example, multiple main processors.

Figure 3:
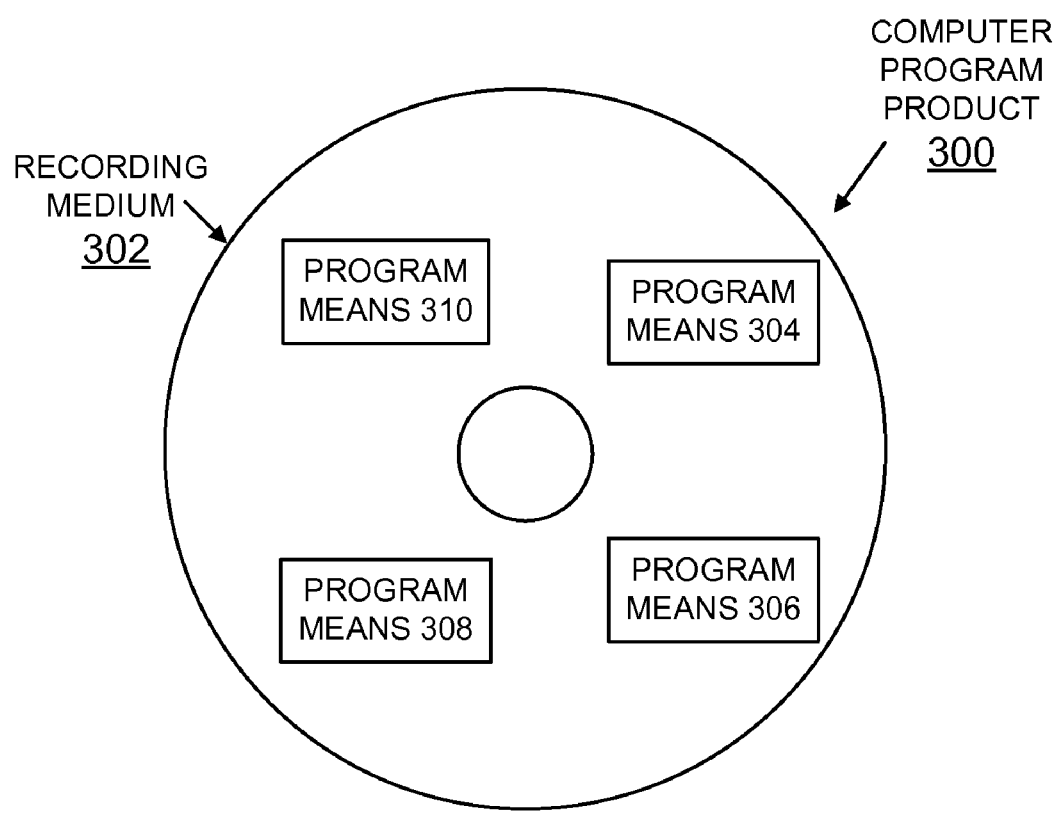
FIG. 3 is a block diagram illustrating a computer program product in accordance with the preferred embodiment.

Referring now to FIG. 3, an article of manufacture or a computer program product 1200 of the invention is illustrated. The computer program product 300 includes a recording medium 302, such as, a floppy disk, a high capacity read only memory in the form of an optically read compact disk or CD-ROM, a tape, or another similar computer program product. Recording medium 302 stores program means 304, 306, 308, 310 on the medium 302 for carrying out the methods for implementing switching factor reduction in Logic Built in Self Test (LBIST) diagnostics of the preferred embodiment in the system 200 of FIG. 2.

A sequence of program instructions or a logical assembly of one or more interrelated modules defined by the recorded program means 304, 306, 308, 310, direct the computer system 200 for implementing switching factor reduction in LBIST diagnostics of the preferred embodiment.

FIGS. 4, 5, 6, and 7 respectively illustrate circuits for implementing switching factor reduction in Logic Built in Self Test (LBIST) diagnostics in accordance with preferred embodiments of the invention.

Figure 4:
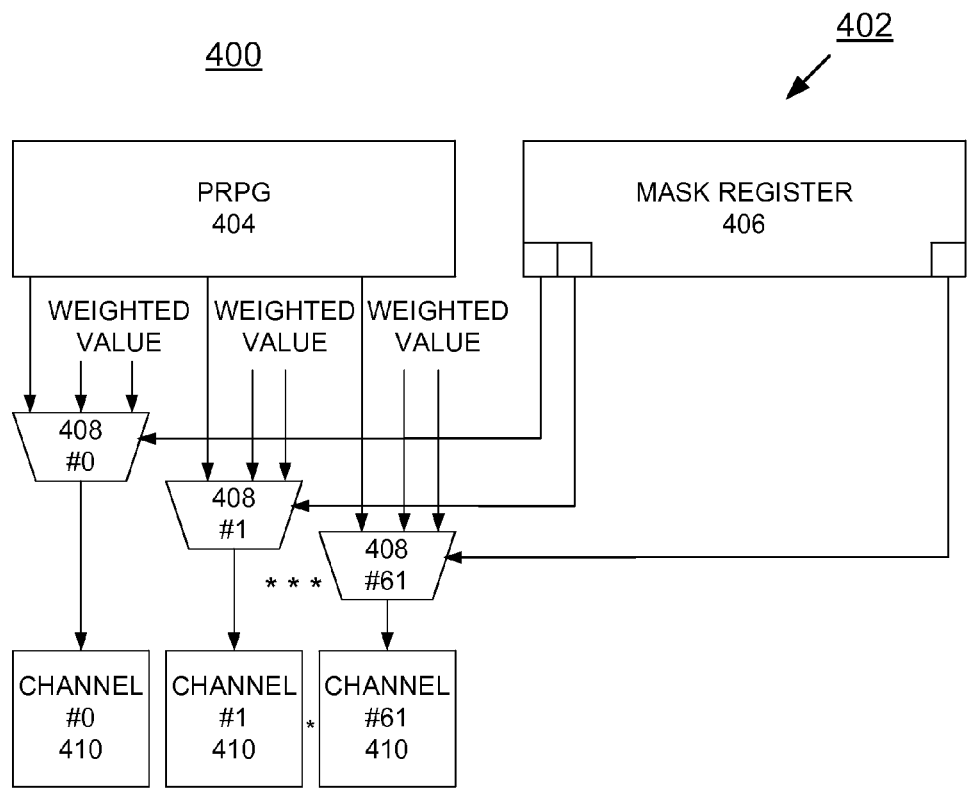
FIGS. 4, 5, 6, and 7 respectively illustrate circuits for implementing switching factor reduction in Logic Built in Self Test (LBIST) diagnostics in accordance with preferred embodiments of the invention.

Referring now to FIG. 4, an example circuit generally designated by the reference character 400 for implementing switching factor reduction in Logic Built in Self Test (LBIST) diagnostics in accordance with the preferred embodiment. Circuit 400 includes switching factor reduction logic generally designated by the reference character 402 coupled to a Pseudo-Random Pattern Generator (PRPG) 404.

Switching factor reduction logic 402 of circuit 400 includes a mask register 406 providing a respective select input to each of a plurality of multiplexers 408. Each of the plurality of multiplexers 408 receives an input from the PRPG 404, a weighted value input, and a not weighted input, each multiplexer 408 providing channel input patterns to a respective one of a plurality of LBIST channels 410 used for the LBIST diagnostics. The switching factor reduction logic 402 selectively provides a one (1) or a zero (0) weighting or not weighted for each of the plurality of channels 410, for each of the 62 channels 410 as shown.

The mask register 406 is used to select a 1 or 0 weighting, or not weighted for each channel at the beginning of the test, making all channels reduce switching, without all channels being weighted the same way.

In accordance with features of the invention, the mask register 406 is rotated for example, before every LBIST scan so that each test has a different mix of which channels are weighted to 1 or 0 or not weighted.

Figure 5:
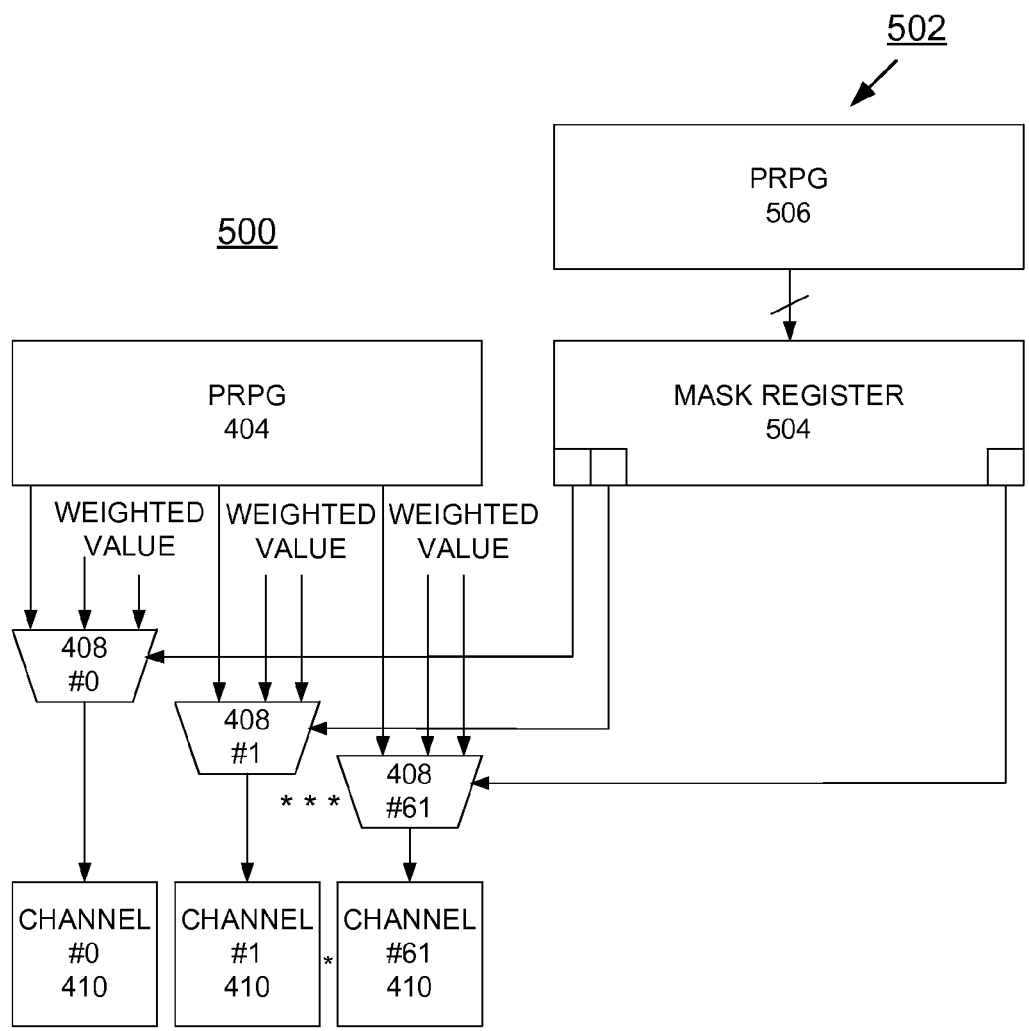

Referring now to FIG. 5, another example circuit generally designated by the reference character 500 for implementing switching factor reduction in Logic Built in Self Test (LBIST) diagnostics in accordance with a preferred embodiment. Circuit 500 includes switching factor reduction logic 502 coupled to the Pseudo-Random Pattern Generator (PRPG) 404.

Switching factor reduction logic 502 of circuit 500 includes a mask register 504 providing a respective input to each of a plurality of multiplexers 408. A PRPG 506 as shown seeds the mask register 504; or alternatively the mask register 504 is seeded by the existing PRPG 404 that feeds data into the LBIST channels 410.

Each of the plurality of multiplexers 408 receives an input from the PRPG 404, and a weighted value input, providing channel input patterns to a plurality of LBIST channels 410 used for the LBIST diagnostics. The switching factor reduction logic 502 selectively provides a one (1) or a zero (0) weighting for each of the plurality of channels 410. The mask register 504 can be functionally implemented by a PRPG, replacing PRPG 506. PRPG 506 is also not limited to classic PRPG structures, but can be implemented by various random producing structures, such as a finite state machine called a Circular Automata (CA), or others.

The mask register 504 typically is updated at the beginning of each scan segment. Note that using a different PRPG 506, with a different polynomial, rather than the PRPG 404 is preferred, for example, to avoid a possible correlation issue. This will at a minimum reduce the number of different weighting initializations to reach a certain coverage level, but looks more likely to increase coverage over generic weighting as well.

Figure 6:
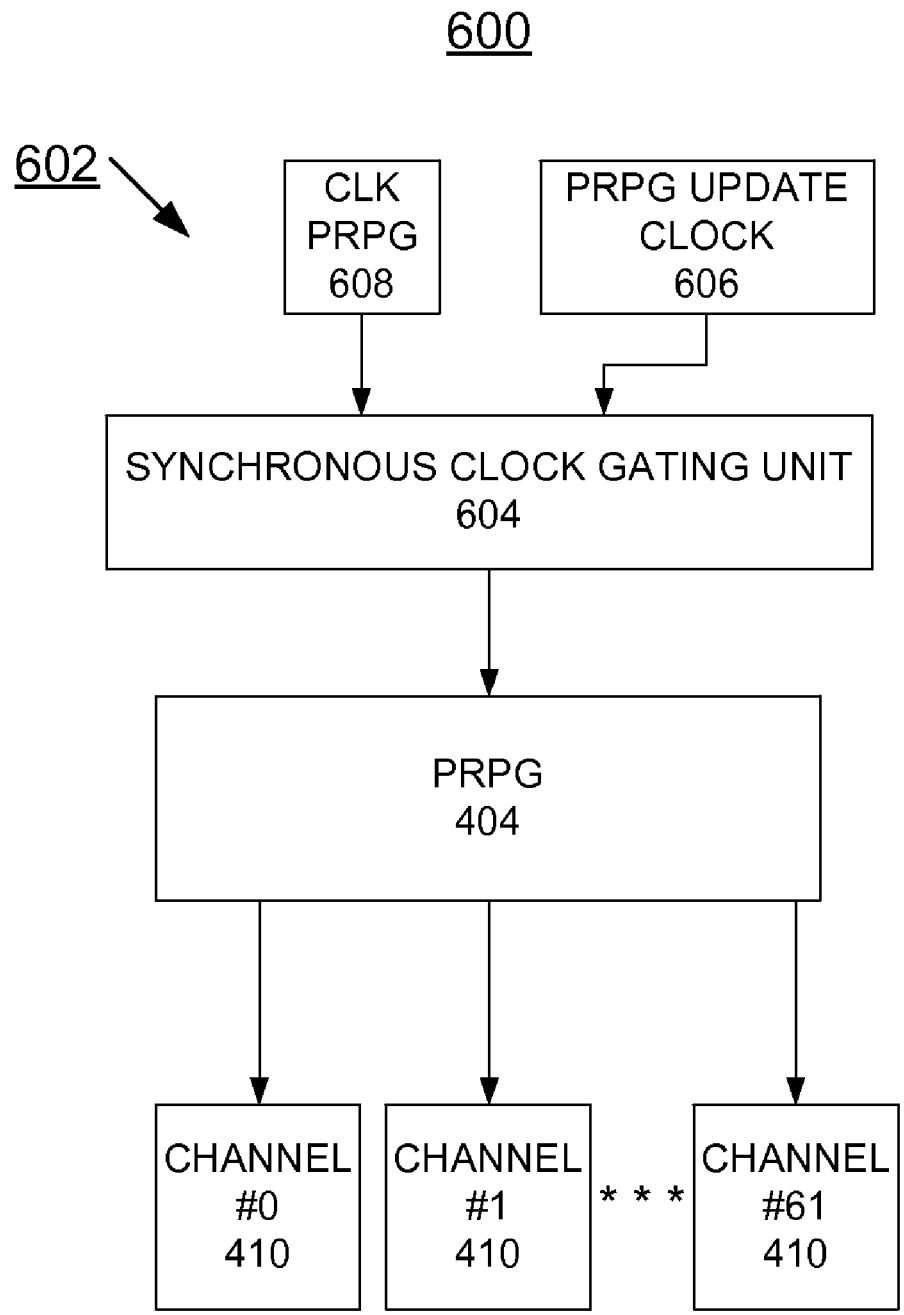

Referring now to FIG. 6, an example circuit generally designated by the reference character 600 for implementing switching factor reduction in Logic Built in Self Test (LBIST) diagnostics in accordance with the preferred embodiment. Circuit 600 includes switching factor reduction logic generally designated by the reference character 602 coupled to a Pseudo-Random Pattern Generator (PRPG) 404 coupled to a plurality of LBIST channels 410.

The switching factor reduction logic 602 implementing pattern stretching is a clock control function coupled to the Pseudo-Random Pattern Generator (PRPG) 404 for selectively providing channel input patterns to the plurality of LBIST channels 410. The clock control function 602 includes a synchronous clock gating unit 604 applying a clock to the PRPG 404. The clock generated by a synchronous clock gating unit 604 is gated, for example, by a PRPG update clock 606 and a signal generated from a small PRPG 608. During a cycle when the PRPG does not get updated, the input pattern would be stable or remains unchanged. The clock gating is applied to an entire PRPG 404, but also could vary between different LBIST PRPGs to increase pattern variation.

Figure 7:
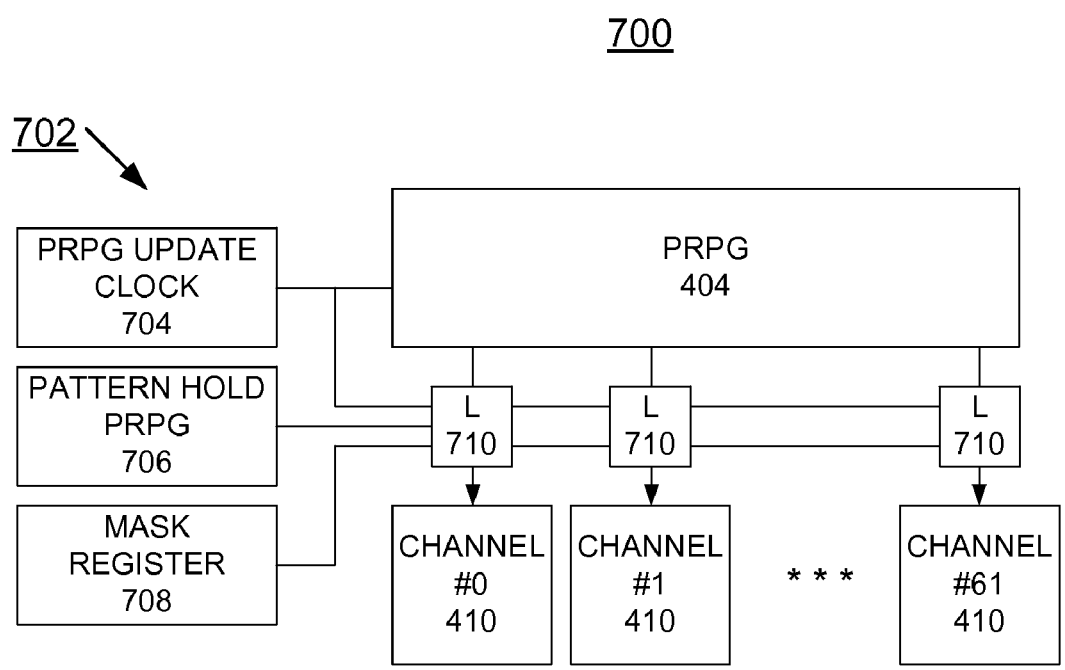

Referring now to FIG. 7, an example circuit generally designated by the reference character 700 for implementing switching factor reduction in Logic Built in Self Test (LBIST) diagnostics in accordance with the preferred embodiment. Circuit 700 includes switching factor reduction logic generally designated by the reference character 702 coupled to a Pseudo-Random Pattern Generator (PRPG) 404.

The switching factor reduction logic 702 implements pattern smearing including a PRPG update clock 704, a pattern hold PRPG 706 to randomly suppress a pattern transition, and a mask register 708. A plurality of scan buffering latches 710 provided with the LBIST channels 410 is used to hold their values during a scan based on the output of the pattern hold PRPG 706. The resulting pattern has a resulting switch factor equal to the ratio of the pattern hold multiplied by the original switch factor. The mask register 708 optionally is applied to the function allowing only certain channels 410 to be subjected to pattern smearing.

Figure 8:
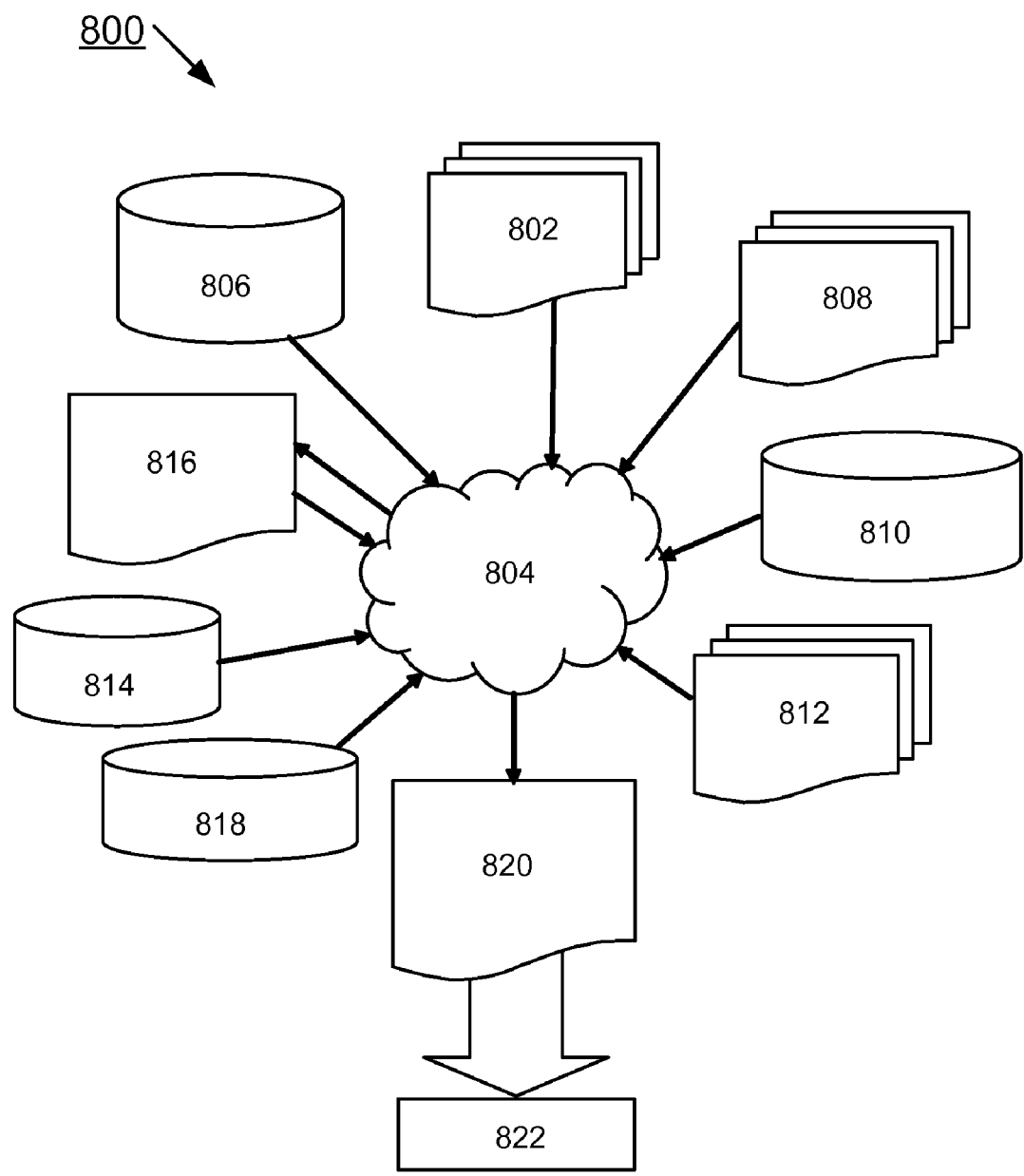
FIG. 8 is a flow diagram of a design process used in semiconductor design, manufacturing, and/or test.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 802 is preferably an input to a design process 804 and may come from an IP provider, a core developer, or other design company or may be generated by the operator of the design flow, or from other sources. Design structure 802 comprises circuits 200, 400, 500, 600, and 700 in the form of schematics or HDL, a hardware-description language, for example, Verilog, VHDL, C, and the like. Design structure 802 may be contained on one or more machine readable medium. For example, design structure 802 may be a text file or a graphical representation of circuits 200, 400, 500, 600, and 700. Design process 804 preferably synthesizes, or translates, circuits 200, 400, 500, 600, and 700 into a netlist 806, where netlist 806 is, for example, a list of wires, transistors, logic gates, control circuits, I/O, models, etc. that describes the connections to other elements and circuits in an integrated circuit design and recorded on at least one of machine readable medium. This may be an iterative process in which netlist 806 is resynthesized one or more times depending on design specifications and parameters for the circuits.

Design process 804 may include using a variety of inputs; for example, inputs from library elements 808 which may house a set of commonly used elements, circuits, and devices, including models, layouts, and symbolic representations, for a given manufacturing technology, such as different technology nodes, 32 nm, 45 nm, 90 nm, and the like, design specifications 810, characterization data 812, verification data 814, design rules 816, and test data files 818, which may include test patterns and other testing information. Design process 804 may further include, for example, standard circuit design processes such as timing analysis, verification, design rule checking, place and route operations, and the like. One of ordinary skill in the art of integrated circuit design can appreciate the extent of possible electronic design automation tools and applications used in design process 804 without deviating from the scope and spirit of the invention. The design structure of the invention is not limited to any specific design flow Design process 804 preferably translates an embodiment of the invention as shown in FIGS. 2, 4, 5, 6, and 7 along with any additional integrated circuit design or data (if applicable), into a second design structure 820. Design structure 820 resides on a storage medium in a data format used for the exchange of layout data of integrated circuits, for example, information stored in a GDSII (GDS2), GL1, OASIS, or any other suitable format for storing such design structures. Design structure 820 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2, 4, 5, 6, and 7. Design structure 820 may then proceed to a stage 822 where, for example, design structure 820 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing switching factor reduction in Logic Built in Self Test (LBIST) diagnostics comprising:

providing switching factor reduction logic coupled to a Pseudo-Random Pattern Generator (PRPG); said Pseudo-Random Pattern Generator (PRPG) for providing channel input patterns to a plurality of LBIST channels used for the LBIST diagnostics;

providing a plurality of multiplexers receiving a respective channel input pattern from said Pseudo-Random Pattern Generator (PRPG), a one weighting value and a zero weighting value, each of said multiplexer receiving a respective select input applied by said switching factor reduction logic; and selectively providing controlled channel input patterns for each of the plurality of LBIST channels using said switching factor reduction logic providing said respective select input to each of said plurality of said multiplexers.

2. The method as recited in claim 1 wherein selectively providing controlled channel input patterns for each of the plurality of LBIST channels using said switching factor reduction logic includes providing a mask register with said switching factor reduction logic, said mask register selecting a 1 or 0 weighting for each LBIST channel at the beginning of the LBIST diagnostics.

3. The method as recited in claim 2 includes using said mask register before each LBIST diagnostics for providing the LBIST diagnostics with a different 1 or 0 weighting for each channel.

4. The method as recited in claim 2 includes using a Pseudo-Random Pattern Generator (PRPG) for seeding said mask register.

5. The method as recited in claim 1 wherein selectively providing controlled channel input patterns for each of the plurality of LBIST channels using said switching factor reduction logic includes providing a clock control function coupled to said Pseudo-Random Pattern Generator (PRPG) for selectively providing channel input patterns to a plurality of LBIST channels.

6. The method as recited in claim 5 includes providing a synchronous clock gating unit coupled to said Pseudo-Random Pattern Generator (PRPG), said synchronous clock gating unit receiving a clock gated signal generated from a Pseudo-Random Pattern Generator (PRPG).

7. The method as recited in claim 6 includes said synchronous clock gating unit receiving a Pseudo-Random Pattern Generator (PRPG) update clock input signal to randomly suppress a pattern transition.

8. A circuit for implementing switching factor reduction in Logic Built in Self Test (LBIST) diagnostics comprising:
a Pseudo-Random Pattern Generator (PRPG); said Pseudo-Random Pattern Generator (PRPG) for providing channel input patterns to a plurality of LBIST channels used for the LBIST diagnostics;
switching factor reduction logic coupled to Pseudo-Random Pattern Generator (PRPG);
a plurality of multiplexers receiving a respective channel input pattern from said Pseudo-Random Pattern Generator (PRPG), a one weighting value and a zero weighting value, each of said multiplexer receiving a respective select input applied by said switching factor reduction logic; and
said plurality of multiplexers selectively providing controlled channel input patterns from said Pseudo-Random Pattern Generator (PRPG) for each of the plurality of LBIST channels, responsive to said switching factor reduction logic providing said respective select input to each of said plurality of said multiplexers.

9. The circuit as recited in claim 8 wherein said switching factor reduction logic includes a mask register, said mask register for selecting a 1 or 0 weighting for each LBIST channel at the beginning of the LBIST diagnostics.

10. The circuit as recited in claim 9 wherein said mask register being updated before each LBIST diagnostics for providing the LBIST diagnostics with a different 1 or 0 weighting for each channel.

11. The circuit as recited in claim 9 includes a Pseudo-Random Pattern Generator (PRPG) for seeding said mask register.

12. The circuit as recited in claim 8 wherein said switching factor reduction logic includes a clock control function coupled to said Pseudo-Random Pattern Generator (PRPG) for selectively providing channel input patterns to a plurality of LBIST channels.

13. The circuit as recited in claim 12 wherein said clock control function includes a synchronous clock gating unit coupled to said Pseudo-Random Pattern Generator (PRPG), said synchronous clock gating unit receiving a clock gated signal generated from a Pseudo-Random Pattern Generator (PRPG).

14. The circuit as recited in claim 13 wherein said synchronous clock gating unit receives a Pseudo-Random Pattern Generator (PRPG) update clock input signal to randomly suppress a pattern transition.

15. A design structure embodied in a non-transitory machine readable medium used in a design process, the design structure comprising:
a circuit tangibly embodied in the non-transitory machine readable medium used in the design process, said circuit for implementing switching factor reduction in Logic Built in Self Test (LBIST) diagnostics, said circuit comprising:
a Pseudo-Random Pattern Generator (PRPG); said Pseudo-Random Pattern Generator (PRPG) for providing channel input patterns to a plurality of LBIST channels used for the LBIST diagnostics;
switching factor reduction logic coupled to Pseudo-Random Pattern Generator (PRPG);
a plurality of multiplexers receiving a respective channel input pattern from said Pseudo-Random Pattern Generator (PRPG), a one weighting value and a zero weighting value, each of said multiplexer receiving a respective select input applied by said switching factor reduction logic; and
said Pseudo-Random Pattern Generator (PRPG) selectively providing controlled channel input patterns for each of the plurality of LBIST channels, responsive to said switching factor reduction logic providing said respective select input to each of said plurality of said multiplexers, wherein the design structure, when read and used in the manufacture of a semiconductor chip produces a chip comprising said circuit.

16. The design structure of claim 15, wherein the design structure comprises a netlist, which describes said circuit.

17. The design structure of claim 15, wherein the design structure resides on storage medium as a data format used for the exchange of layout data of integrated circuits.

18. The design structure of claim 15, wherein the design structure includes at least one of test data files, characterization data, verification data, or design specifications.

* * * * *